US009099514B2

(12) United States Patent
Lin et al.

(10) Patent No.: US 9,099,514 B2
(45) Date of Patent: Aug. 4, 2015

(54) WAFER HOLDER WITH TAPERED REGION

(75) Inventors: Yi-Hung Lin, Taipei (TW); Li-Ting Wang, Tainan (TW); Tze-Liang Lee, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 544 days.

(21) Appl. No.: 13/426,334

(22) Filed: Mar. 21, 2012

(65) Prior Publication Data

US 2013/0252424 A1 Sep. 26, 2013

(51) Int. Cl.
| A47G 19/08 | (2006.01) |
| H01L 21/687 | (2006.01) |
| H01L 21/683 | (2006.01) |
| H01L 21/477 | (2006.01) |
| H01L 21/306 | (2006.01) |
| H01L 21/673 | (2006.01) |

(52) U.S. Cl.
CPC ........ H01L 21/68735 (2013.01); H01L 21/306 (2013.01); H01L 21/477 (2013.01); H01L 21/67303 (2013.01); H01L 21/683 (2013.01)

(58) Field of Classification Search
CPC .................. H01L 21/67303; H01L 21/67309; H01L 21/683; H01L 21/67369; H01L 21/67363; H01L 21/67383; H01L 21/67236; H01L 21/306; H01L 21/324; H01L 21/302; H01L 21/477; H01L 21/68735; B65D 85/48
USPC ................. 211/41.18, 40; 206/454, 710, 832; 414/935, 936, 937, 940, 941; 438/689, 438/758, 795; 269/287; 219/444.1; 257/E21.219, E21.214, E21.317
See application file for complete search history.

(56) References Cited

U.S. PATENT DOCUMENTS

| 5,718,574 | A | * | 2/1998 | Shimazu ................. 432/253 |
| 5,794,798 | A | * | 8/1998 | Kim ...................... 211/41.18 |
| 5,880,933 | A | * | 3/1999 | Markow et al. ........... 361/704 |
| 5,891,251 | A | * | 4/1999 | MacLeish et al. ......... 118/719 |
| 6,001,183 | A |   | 12/1999 | Gurary et al. |
| 6,145,673 | A | * | 11/2000 | Burrows et al. ........ 211/41.18 |

(Continued)

FOREIGN PATENT DOCUMENTS

| JP | 7-277885 A | 10/1995 |
| JP | 2004-55595 A | 2/2004 |
| KR | 10-2010-0053614 | 5/2010 |

OTHER PUBLICATIONS

Japanese Patent Office, Notice of Allowance issued Jan. 28, 2015, Application No. 10-2012-0152177, 3 pages.

*Primary Examiner* — Jennifer E Novosad
(74) *Attorney, Agent, or Firm* — Haynes and Boone, LLP

(57) ABSTRACT

An apparatus, a system and a method are disclosed. An exemplary apparatus includes a wafer holder including a first portion and a second portion. The first and second portions are formed of the same continuous material. The first portion includes a first upper surface and a first lower surface, and the second portion including a second upper surface and a second lower surface. The apparatus further includes an interface between the first and second portions. The interface provides for a transition such that the first upper surface of the first portion tends toward the second upper surface of the second portion. The apparatus further includes a tapered region formed in the first portion. The tapered region starts at a radial distance from a center line of the wafer holder and terminates at the interface. The tapered region has an initial thickness that gradually decreases to a final thickness.

17 Claims, 6 Drawing Sheets

(56) References Cited

U.S. PATENT DOCUMENTS

| | | | |
|---|---|---|---|
| 6,316,361 B1 * | 11/2001 | Hansson | 438/680 |
| 6,455,821 B1 * | 9/2002 | Stumbo | 219/497 |
| 6,474,987 B1 * | 11/2002 | Nakai et al. | 432/258 |
| 6,761,771 B2 * | 7/2004 | Satoh et al. | 118/725 |
| 7,017,749 B2 * | 3/2006 | Yajima et al. | 206/711 |
| 7,077,912 B2 * | 7/2006 | Park et al. | 118/725 |
| 7,077,913 B2 * | 7/2006 | Shimada | 118/725 |
| 7,204,887 B2 * | 4/2007 | Kawamura et al. | 118/725 |
| 7,219,802 B2 * | 5/2007 | Wiseman et al. | 206/710 |
| 7,399,657 B2 * | 7/2008 | Bolken et al. | 438/106 |
| 7,432,476 B2 * | 10/2008 | Morita et al. | 219/444.1 |
| 7,530,462 B2 * | 5/2009 | Yajima et al. | 206/710 |
| 2003/0016447 A1 * | 1/2003 | Kato et al. | 359/569 |
| 2003/0183612 A1 * | 10/2003 | Timans et al. | 219/390 |
| 2008/0041798 A1 * | 2/2008 | Gilmore et al. | 211/41.18 |
| 2008/0264343 A1 * | 10/2008 | Hagihara | 118/728 |
| 2009/0139977 A1 * | 6/2009 | Falter et al. | 219/405 |
| 2009/0169346 A1 * | 7/2009 | Hamono et al. | 414/225.01 |
| 2009/0310648 A1 * | 12/2009 | Granneman et al. | 374/201 |
| 2009/0321372 A1 * | 12/2009 | Gilmore et al. | 211/41.18 |
| 2013/0032508 A1 * | 2/2013 | Azuma | 206/710 |
| 2013/0252189 A1 * | 9/2013 | Lin et al. | 432/1 |
| 2013/0252424 A1 * | 9/2013 | Lin et al. | 438/689 |
| 2014/0346037 A1 * | 11/2014 | Mizuno et al. | 204/298.08 |

* cited by examiner

WAFER HOLDER WITH TAPERED REGION

CROSS-REFERENCE TO RELATED APPLICATION

The present disclosure is related to U.S. patent application Ser. No. 13/428,749 by inventors Yi-Hung Lin, et al., entitled "WAFER HOLDER WITH VARYING SURFACE," filed concurrently herewith, which is hereby incorporated by reference in its entirety.

BACKGROUND

In some semiconductor manufacturing processes, wafer processing chambers or reactors are used to process wafers from which integrated circuits are made. During the manufacturing process, a wafer is placed on a wafer holder (or susceptor). After the wafer has been placed on the wafer holder, it is placed in a processing chamber or reactor where a process, which has non-steady state temperatures, is performed using backside lamps. The backside lamps may include one or more lamps placed under the wafer holder to heat the wafer holder and the wafer.

For example, a rapid thermal process (RTP), using backside lamps, may be performed to deposit film layers on the wafer. This may be referred to as chemical vapor deposition (CVD). As the CVD process is carried out, the amount of film deposited on the wafer may vary as a function of the temperature of the wafer. The wafer temperature may not be uniform for a variety of reasons. For example, the wafer temperature may not be uniform because the wafer edge transfers heat to the underlying wafer holder, thereby causing a temperature difference between the wafer edge and the wafer center. As such, the uneven wafer temperature results in uneven/varying film deposition that ultimately adversely affects the performance of the integrated circuit made from the wafer. Temperature uniformity can also be important for other non-steady or RTP temperature processing such as annealing, doping, etching, and other processes. Accordingly, there is a need for a wafer holder (susceptor) that more uniformly controls wafer temperature during non-steady state conditions.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
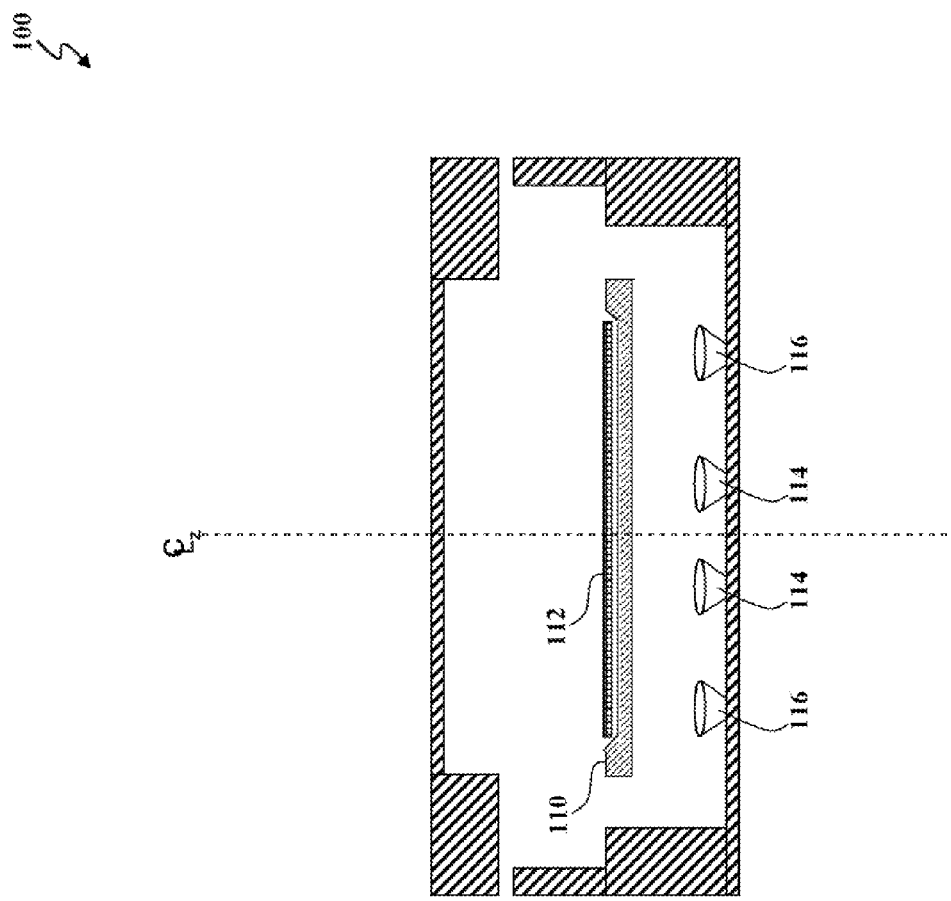
FIG. 1 illustrates a cross-sectional view of one embodiment of a wafer processing chamber within which a wafer holder in accordance to various aspects of the present disclosure can be utilized.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

With reference to FIG. 1, illustrated is a cross-sectional view of one embodiment of a wafer processing chamber 100 within which a wafer holder 110 in accordance to various aspects of the present disclosure can be utilized. The wafer holder 110 is made of quartz. Alternatively, the wafer holder 110 may be made of any other suitable material. The wafer holder 110 holds a wafer 112 which is processed in the wafer processing chamber 100. The wafer 112 is a 300 mm diameter wafer. Alternatively, the wafer 112 is a 450 mm diameter wafer, or any other suitable diameter wafer. As such, the wafer holder 110 may be provided with varying dimensions for processing different size wafers 112. The wafer 112 is held on the wafer holder 110 at a distance such that it is suspended over the wafer holder 112. Alternatively, the wafer 112 is in direct contact with the wafer holder 110. As will be further discussed below, in the present embodiment, the wafer 112 is suspended over the wafer holder 110 by contact pins, each pin having a height of about 1 mm and located about 135 mm radially from the center of the 300 mm wafer 112. Alternatively, the wafer 112 is suspended over the wafer holder 110 by any means appropriate and at any distance according to design requirements. The wafer 112 may include an elementary semiconductor material, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

The wafer processing chamber 100 further includes radiant heat elements such as one or more center backside lamps 114 and one or more edge backside lamps 116. The center/edge lamps 114, 116 may be positioned in a uniform circular formation about the center line (CL) such that the overlying wafer holder 110 and wafer 112 are evenly exposed to the radiant light and thereby heated. It is understood that although in the present illustration only two center/edge lamps 114, 116 are shown, any number of center/edge lamps may be provided. The wafer processing chamber 100 may further include upper lamps, gas delivery mechanisms, pressure control mechanisms, vents, and any other suitable structures and mechanisms in accordance with design requirements.

Still referring to FIG. 1, during operation, for example, a spike heating process may be employed that uses the one or more center backside lamps 114 and the one or more edge backside lamps 116 to expose the wafer 112 to the radiant light through the quartz wafer holder 110 and thereby heat the wafer 112. The spike heating process may heat the wafer 112 from about 20° C. to about 1100° C. in about 0.5 seconds to about 60 seconds and then cooled just as rapidly. During the heating process, however, the wafer 112 may have non uniform temperature as the edge of the wafer 112 tends to be cooler then the center of the wafer 112. Non uniform temperature of the wafer 112 may result from a number of factors. For example, the chamber design may be such that the distance between the wafer and the backside lamps is not short enough or the backside lamps span is not wide enough to properly/evenly heat the wafer 112, thereby leading to non uniform temperature of the wafer 112 (center to edge). Additionally, during the heating process, the wafer holder 112 may act as a heat sink (due to its mass and lower temperature) and thus absorb thermal energy from the wafer 112 at the outer edges. Notably, wafer temperature non uniformity concerns (cooler edge and hotter center) have been observed even with center backside lamps 114 being turned off. It is understood that although the present example discusses spike heating process, the embodiments of the present disclosure are equally applicable to rapid thermal processes (RTP) and other non-steady state heating process utilizing backside lamps.

Figure 2:
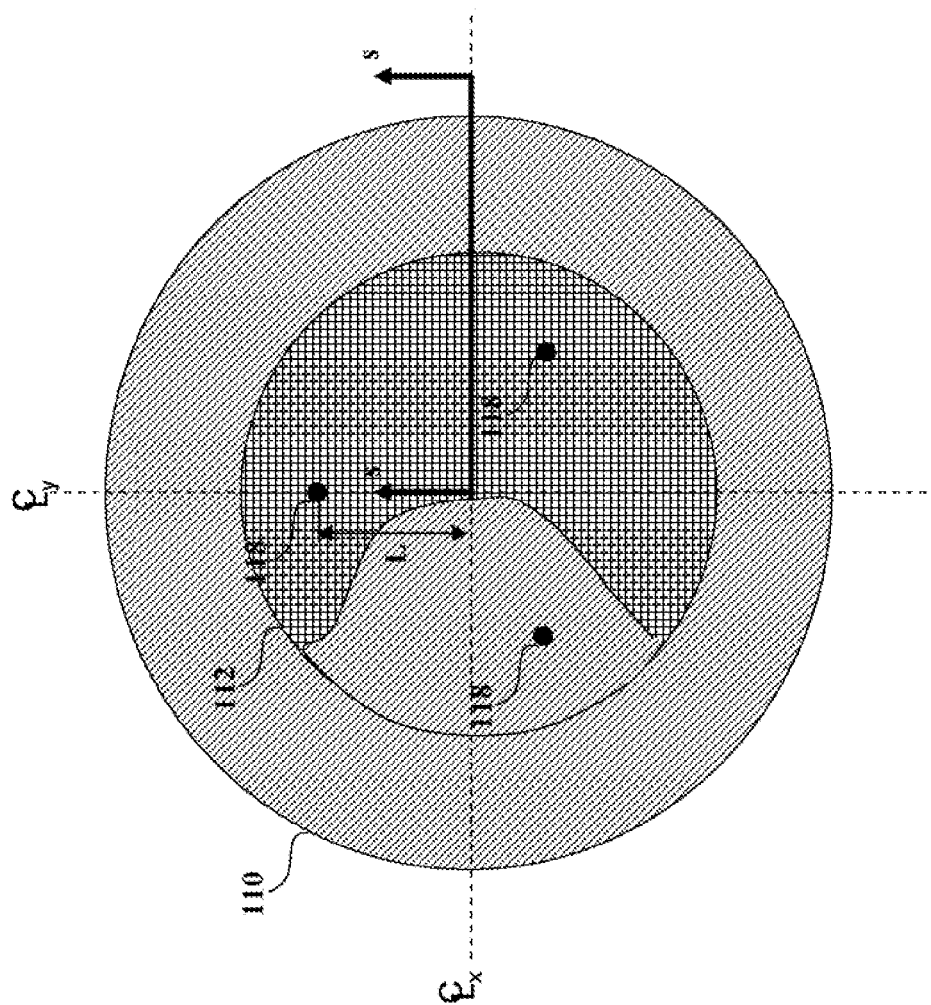
FIG. 2 illustrates a top view of one embodiment of a wafer holder according to various aspects of the present disclosure.

With reference to FIG. 2, illustrated is a top view of one embodiment of the wafer holder 110 and the wafer 112, of FIG. 1, according to various aspects of the present disclosure. As illustrated, the wafer holder 110 extends beyond the area covered by the wafer 112. Thus, the ratio of the surface area of the wafer holder 110 to the wafer 112 may be from about 1:1 to about 4:1. In the present embodiment, the surface area of the wafer holder 110 to the wafer 112 is about 2:1. In the present embodiment, the wafer 112 is suspended over the wafer holder 110 thereby forming an air gap between the two structures. The wafer 112, is suspended over the wafer holder 110 by three contact pins 118. The contact pins 118 may be made of quartz or any suitable material. In the present embodiment, each contact pin 118 has a thickness ranging from about 0.5 mm to about 2 mm and is located at a distance L, which is about 135 mm radially from the center of the 300 mm wafer 112. As illustrated, each pin 118 is substantially equally spaced apart one from the other. It is understood that the distance L may be any suitable distance such that the wafer is properly supported and that any number of pins, other support structures, or other support mechanisms may be used. It is further understood that the proximity of the wafer 112 to the wafer holder 110 affects heat transfer between the two structures. As such, the distance between the wafer holder 110 and the wafer 112 may be used to tune the heat transfer between the two structures. Accordingly, the thickness of the contact pins 118 may be any suitable thickness, according to design requirements. In alternative embodiments, no contact pins 118 are used and the wafer 112 is placed directly on the wafer holder 110.

Figure 3:
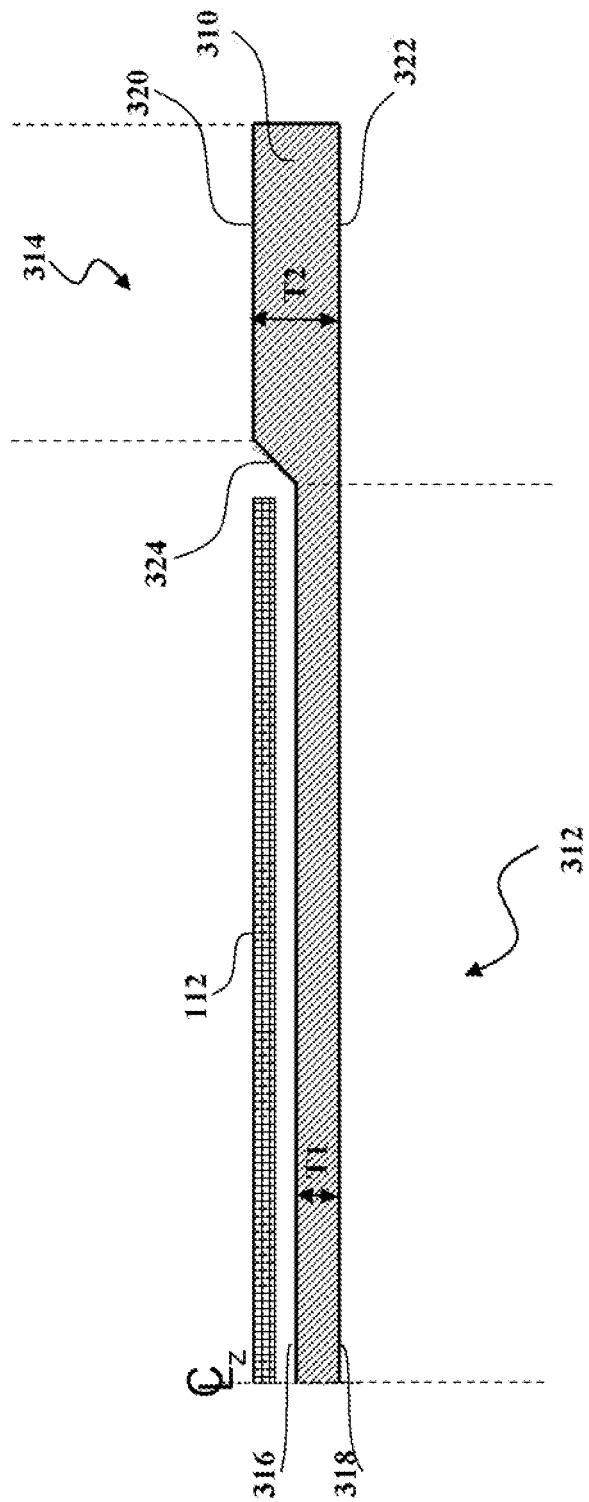
FIG. 3 illustrates a cross-sectional side view of a wafer holder according to various aspects of the present disclosure.
Figure 4:
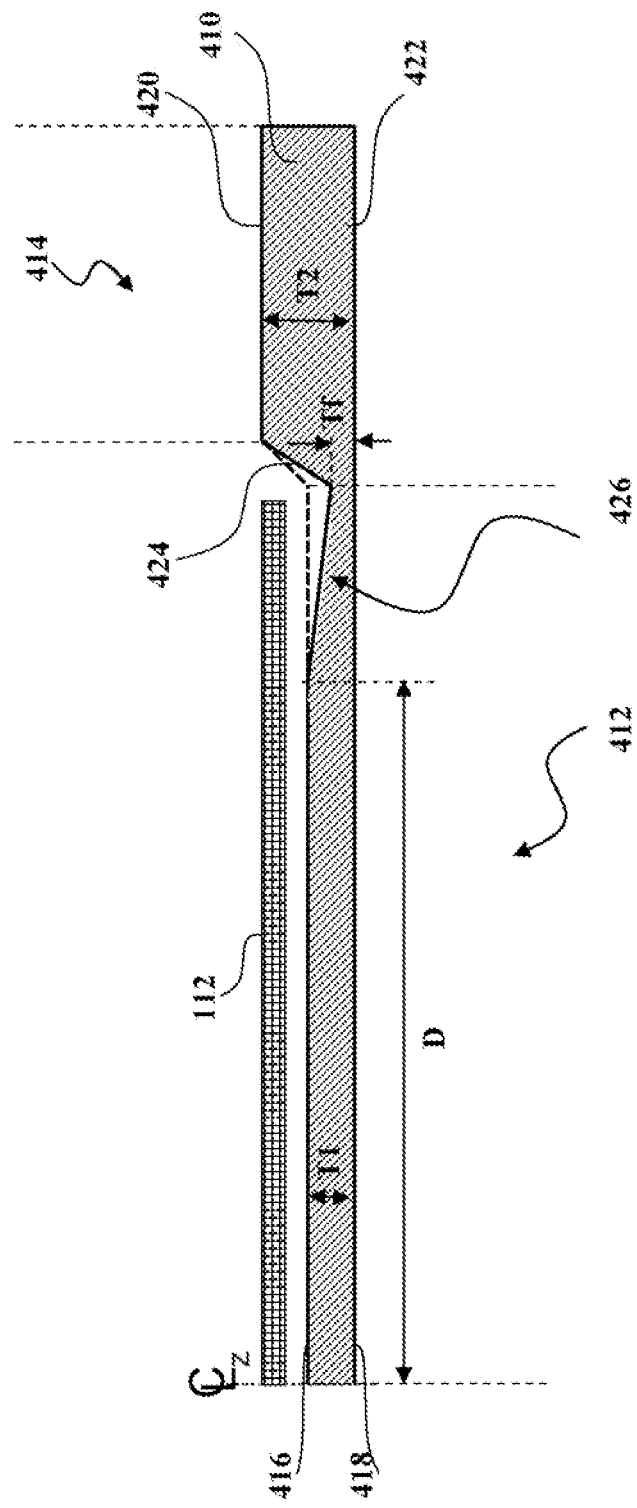
FIG. 4 illustrates a cross-sectional side view of a wafer holder according to various aspects of the present disclosure.
Figure 5:
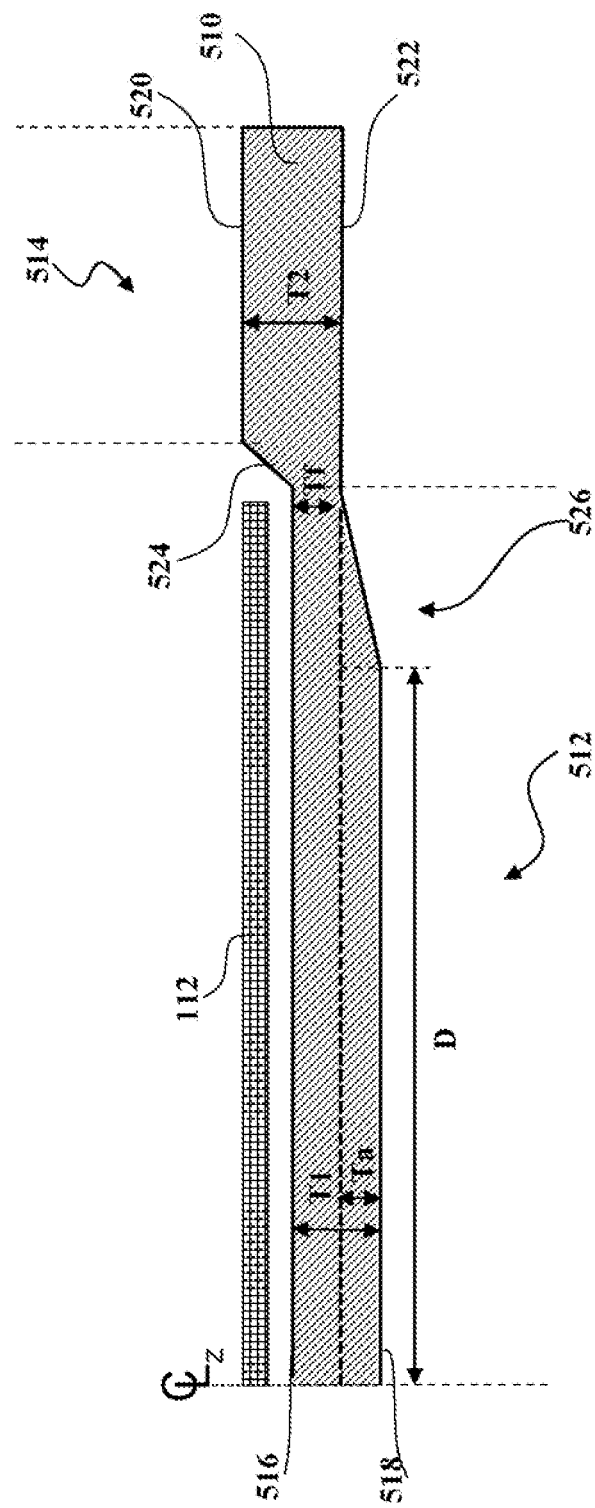
FIG. 5 illustrates a cross-sectional side view of a wafer holder according to various aspects of the present disclosure.

With reference to FIGS. 3-5, illustrated is a cross-sectional side view of various embodiments wafer holders, taken along lines s-s of FIG. 2, according to various aspects of the present disclosure. The wafer holders 310, 410, and 510, of FIGS. 3-5, respectively, are substantially the same as the wafer holder 110 of FIGS. 1-2, in terms of structure and composition.

Referring to FIG. 3, illustrated is a cross-sectional side view of a wafer holder 310 according to various aspects of the present disclosure. In the illustrated embodiment, the wafer holder 310 includes a contact portion referred to as a first portion 312 that the wafer 112 overlies and an exterior portion referred to as a second portion 314 that extends beyond the wafer 112. The first portion 312 covers a radial distance of at least the radius of the wafer 112. In the illustrated embodiment, the first portion 312 includes an upper surface 316 and a lower surface 318. The lower surface 318 faces the backside lamps (114, 116 of FIG. 1) and the upper surface 316 faces a lower surface of the wafer 112. In the illustrated embodiment, the upper and lower surfaces 316, 318 of the first portion 312 are substantially parallel one with the other and with the lower surface of the wafer 112. The first portion 312 has a first thickness of T1, measured from the upper surface 316 to the lower surface 318. The first thickness T1 of the wafer holder 310 may be any suitable thickness such that the wafer 112 is adequately supported. In the present embodiment, for example, the first thickness T1 is about 2 mm.

Still referring to FIG. 3, the second portion 314 includes an upper surface 320 and a lower surface 322 substantially parallel one with the other. The second portion 314 has a second thickness of T2, measured from the upper surface 320 to the lower surface 322. The second thickness T2 of the wafer holder 310 may be any suitable thickness such that the wafer 112 is adequately supported. In the present embodiment, for example, the second thickness T2 is about 3 mm. At the interface 324 where the first portion 312 and the second portion 314 meet a transition occurs such that the upper surface 316 of the first portion 312 tends toward the upper surface 320 of the second portion 314. It is understood that although in the present embodiment the interface 324 has a single linear profile, one or more linear or nonlinear, or any suitable profile may be used according to design requirements.

The illustrated embodiment of FIG. 3, however, may have temperature uniformity concerns as the close proximity of the wafer holder 310 to the wafer 112 may result in significant heat transfer between the two structures and/or the lack of sufficient amount of radiant energy from the backside lamps does not sufficiently heat the outer edge of the wafer 112.

Referring to FIG. 4, illustrated is a cross-sectional side view of a wafer holder 410 according to various aspects of the present disclosure. The illustrated embodiment of the wafer holder 410 serves to enable wafer center-to-edge temperature control for backside non-steady state heating process. In the illustrated embodiment, the wafer holder 410 includes a first portion 412 that the wafer 112 overlies and a second portion 414 that extends beyond the wafer 112. In the illustrated embodiment, the first portion 412 includes an upper surface 416 and a lower surface 418. The lower surface 418 faces the backside lamps (114, 116 of FIG. 1) and the upper surface 416 faces a lower surface of the wafer 112. In the illustrated embodiment, from the center line (CL) to a radial distance D, the upper and lower surfaces 416, 418 of the first portion 412 are substantially parallel one with the other and with the lower surface of the wafer 112. The radial distance D may be a distance from about 70% to about 90% of the total radius of the wafer 112. For example, in the illustrated embodiment, the wafer 112 is a 300 mm wafer having a radius of 150 mm; thus, in the present embodiment, the radial distance D ranges from about 105 mm to about 135 mm. It is understood that for other size wafers the radial distance D will be calculated according to the above criteria and thus have different respective range values. In the portion from about the center line (CL) to the radial distance D, the first portion 412 has a first thickness of T1, measured from the upper surface 416 to the lower surface 418. The first thickness T1 of the wafer holder 410 may range from about 0.5 mm to about 5 mm, or may be any suitable thickness such that the wafer 112 is adequately supported. In the present embodiment, for example, the first thickness T1 is about 2 mm.

The first portion 412 further includes a tapered region 426. The tapered region 426 ranges from the radial distance D to at least the wafer edge radius. In the tapered region 426, the upper surface 416 of the wafer holder 410 is tapered such that it gradually trims down to a final thickness Tf. In the present embodiment, the tapered region 426 has a single constantly decreasing profile that is linear. In alternative embodiments, the tapered region 426 has a profile such as, for example, a nonlinear profile, multiple linear profiles, and any other suitable profile. The wafer holder 410 may be trimmed down to any final thickness Tf as long as the mechanical strength of the wafer holder 410 is sufficient to support the wafer 112. For example, in the present embodiment, the final thickness Tf is about 50% of the first thickness T1 (Tf is about 1 mm). In alternative embodiments, for example, the final thickness TF is less then about 1 mm and may be as low as about 0.5 mm. In yet other alternative embodiments, the final thickness Tf is any suitable thickness.

Still referring to FIG. 4, the second portion 414 includes an upper surface 420 and a lower surface 422, substantially parallel one with the other. As illustrated, in the present embodiment, the lower surface 418 of the first portion 412 is in a common plane with the lower surface 422 of the second portion 414. The second portion 414 has a second thickness of T2, measured from the upper surface 420 to the lower surface 422. The second thickness T2 of the wafer holder 410 ranges from about 4 mm to about 1 mm, or may be any suitable thickness such that the wafer 112 is adequately supported. In the present embodiment, for example, the second thickness T2 is about 3 mm. At the interface 424 where the first portion 412 and the second portion 414 meet, a transition occurs such that the upper surface 416 of the first portion 412 tends toward the upper surface 420 of the second portion 414. It is understood that although in the present embodiment the interface 424 has a single linear profile, one or more linear or nonlinear, or any suitable profile may be used according to design requirements.

When comparing the wafer holder 410 of FIG. 4 with the wafer holder 310 of FIG. 3, seen at least is a difference in material thickness illustrated as dashed line region over the tapered region 426 of the first portion 412. In the present embodiment, the material thickness is reduced over the tapered region 426 from the first thickness T1 down to a final thickness Tf in a constant linear profile. In alternative embodiments, the material thickness is reduced over the tapered region 426 from the first thickness T1 down to a final thickness Tf in a non-linear profile which may include a curve profile, multiple linear profiles, step profiles, and other appropriate profiles. The material difference (shown by the dashed line) provides for a reduction in thermal loss at the wafer 112 edge as there is a greater distance between the wafer 112 and the underlying wafer holder 410. Additionally, the reduced thickness along the tapered region 426 reduces the mass of the wafer holder 410 thereby further reducing heat transfer between the two structures. Moreover, the reduced thickness of the wafer holder 410 in the taperd region 426 allows for a greater amount of radiant energy from the underlying backside lamps to reach the edge of the wafer 112 thereby increasing the temperature of the edge of the wafer 112. Accordingly, the illustrated embodiment of FIG. 4 allows for a reduction in heat transfer from the edge of the wafer 112 to the wafer holder 410 and for additional radiant energy to reach the edge of the wafer 112, thereby providing for a method to uniformly control the temperature of the wafer 112 such that the temperature difference between the wafer 112 center and edge is minimized.

Referring to FIG. 5, illustrated is a cross-sectional side view of a wafer holder 510 according to various aspects of the present disclosure. The illustrated embodiment of the wafer holder 510 serves to enable wafer center-to-edge temperature control for backside non-steady state heating process. In the illustrated embodiment, the wafer holder 510 includes a first portion 512 that the wafer 112 overlies and a second portion 514 that extends beyond the wafer 112. In the illustrated embodiment, the first portion 512 includes an upper surface 516 and a lower surface 518. The lower surface 518 faces the backside lamps (114, 116 of FIG. 1) and the upper surface 516 faces a lower surface of the wafer 112. In the illustrated embodiment, from the center line (CL) to a radial distance D, the upper and lower surfaces 516, 518 of the first portion 512 are substantially parallel one with the other and with the lower surface of the wafer 112. The radial distance D may be a distance from about 70% to about 90% of the total radius of the wafer 112. For example, in the illustrated embodiment, the wafer 112 is a 300 mm wafer having a radius of 150 mm; thus, in the present embodiment, the radial distance D ranges from about 105 mm to about 135 mm. It is understood that for other size wafers the radial distance D will be calculated according to the above criteria and thus have different respective range values. In the area from about the center line (CL) to the radial distance D, the first portion 512 has a first thickness of T1, measured from the upper surface 516 to the lower surface 518. The first thickness T1 of the wafer holder 510 includes a range from about 2 mm to about 5 mm, or may be any suitable thickness such that the wafer 112 is adequately supported but may be limited by the available space in the chamber. In the present embodiment, for example, the first thickness T1 is about 4 mm.

The first portion 512 further includes a tapered region 526. The tapered region 526 ranges from the radial distance D to at least the wafer edge radius. In the tapered region 526 the lower surface 518 of the wafer holder 510 is tapered such that it gradually trims down to a final thickness Tf. In the present embodiment, the tapered region 526 has a single constantly decreasing profile that is linear. In alternative embodiments, the tapered region 526 has a profile such as, for example, a nonlinear profile, multiple linear profiles, and any other suitable profile. The wafer holder 510 may be trimmed down to any final thickness Tf as long as the mechanical strength of the wafer holder 510 is sufficient to support the wafer 112. For example, in the present embodiment, the final thickness Tf is about 50% of the first thickness T1 (Tf is about 2 mm).

Still referring to FIG. 5, the second portion 514 includes an upper surface 520 and a lower surface 522, substantially parallel one with the other. As illustrated, in the present embodiment, the first portion 512 and the second portion 514 have no surfaces in a common plane. In the present embodiment, the lower surface 522 begins where the tapering of the lower surface 518 ends. The second portion 514 has a second thickness of T2, measured from the upper surface 520 to the lower surface 522. The second thickness T2 of the wafer holder 510 includes a range from about 1 mm to about 4 mm, or may be any suitable thickness such that the wafer 112 is adequately supported. In the present embodiment, for example, the second thickness T2 is about 3 mm. At the interface 524 where the first portion 512 and the second portion 514 meet, a transition occurs such that the upper surface 516 of the first portion 512 tends toward the upper surface 520 of the second portion 514. It is understood that although in the present embodiment the interface 524 has a single linear profile, one or more linear or nonlinear, or any suitable profile may be used according to design requirements. It is further understood that the tapering of the lower surface 518 may extend beyond the transition region 524 between the upper surfaces 516, 520 of the first and second portions 512, 514, thereby also reducing the thickness T2 of the second portion 514.

When comparing the wafer holder 510 of FIG. 5 with the wafer holder 310 of FIG. 3, seen at least is a difference in material thickness of added material thickness Ta, in the portion of the first portion 512. The point where material is added may be represented by the dashed line. The added material thickness Ta provides for a reduction in thermal energy at the wafer 112 center as the wafer holder 510 blocks more thermal energy. Further, because there is added mass due to the added thickness Ta to the wafer holder 510, the wafer holder 510 acts as a heat sink in the center of the wafer 112 thereby reducing the wafer 112 center thermal energy. Accordingly, the illustrated embodiment of FIG. 5 allows for a increased heat transfer from the center of the wafer 112 to the wafer holder 510 and for less radiant energy to reach the center of the wafer 112, thereby providing for a method to uniformly control the temperature of the wafer 112 such that the temperature difference between the wafer 112 center and edge is minimized.

Figure 6:
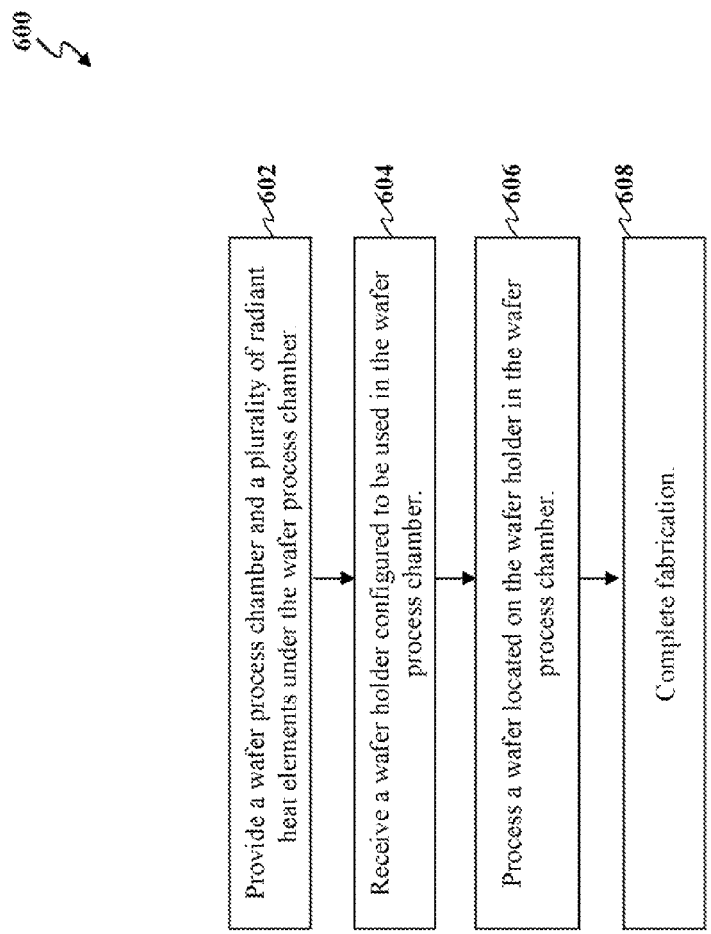
FIG. 6 illustrates a method of utilizing the wafer holders of FIGS. 3 to 5, according to various aspects of the present disclosure.

With reference to FIG. 6, a method 600 of using the wafer holders of FIGS. 3 to 5, according to various aspects of the present disclosure is provided. The method 600 begins at block 602 where a wafer process chamber and a plurality of backside radiant heating elements are provided. The method continues at block 604 where a wafer holder configured to be used in the wafer process chamber is received. The wafer holder is a wafer holder similar to the wafer holders 310, 410, and 510 of FIGS. 3-5. The method 600 continues at block 606 where a wafer located on the wafer holder in the wafer process chamber is processed. The processing may include using the backside heating elements to heat the wafer in the process chamber and perform a process such as chemical vapor deposition, annealing, etching, doping, or any other suitable process. The method 600 continues with block 608 where fabrication is completed. Additional steps can be provided before, during, and after the method 600, and some of the steps described can be replaced or eliminated for other embodiments of the method.

The above embodiments of the wafer holder 301, 410, 510, and method 600 enable wafer center-to-edge temperature control for backside non-steady state heating process such as spike heating processes, RTA heating processes, and other non-steady state heating processes. During non-steady state backside heating, the wafer holders 301, 410, 510, provide for reduced heat transfer from the edge of the wafer to the wafer holder and for increased amount of radiant energy to reach the edge of the wafer, to thereby enable wafer center-to-edge temperature control. Also, the wafer holders provide for increased heat transfer from the center of the wafer to the wafer holder and for less radiant energy to reach the center of the wafer, to thereby enable wafer center-to-edge temperature control. Further, the more uniform wafer temperatures provide benefits during non-steady state backside heating semiconductor manufacturing processing such as chemical vapor deposition (CVD), annealing, doping, etching, and other suitable processes which ultimately improve the performance of resulting integrated circuits, reduce manufacturing cost, cycle time, and increase production yields, when compared with traditional processes. Also, the wafer holders described herein provide for a low risk alteration to current wafer holders that can be easily implemented into current process and technology, thereby lowering cost and minimizing complexity. For example, the wafer holders described herein can be implemented into current processes without affecting the wafer processing/reaction chamber's height or base width, and without the need of additional components. Different embodiments may have different advantages, and no particular advantage is necessarily required of any embodiment.

Thus, provided is an apparatus. The exemplary apparatus includes a wafer holder including a first portion and a second portion. The first and second portions are formed of the same continuous material. The first portion includes a first upper surface and a first lower surface, and the second portion including a second upper surface and a second lower surface. The apparatus further includes an interface between the first and second portions. The interface provides for a transition such that the first upper surface of the first portion tends toward the second upper surface of the second portion. The apparatus further includes a tapered region formed in the first portion. The tapered region starts at a radial distance from a center line of the wafer holder and terminates at the interface. The tapered region has an initial thickness that gradually decreases to a final thickness.

In some embodiments, the tapered region has a single linear profile, the radial distance ranges from about 70% to about 90% of a radius of a wafer that the wafer holder is configured to hold, and the wafer holder includes quartz. In various embodiments, the interface starts at another radial distance from the center line of the wafer holder, and the another radial distance is at least greater than the radius of the wafer that the wafer holder is configured to hold. In certain embodiments, a thickness of the first portion is less than a thickness of the second portion. In further embodiments, the thickness of the first portion ranges from about 0.5 mm to about 2 mm, and the thickness of the second portion ranges from about 2 mm to about 3 mm. In some embodiments, the initial thickness ranges from about 1 mm to about 2 mm, and the final thickness is less than about 1 mm. In various embodiments, from the center line to about the radial distance, the first upper surface and the first lower surface are substantially parallel one with the other, the second upper surface and the second lower surface are parallel one with the other, and the first lower surface is in a common plane with the second lower surface. In certain embodiments, the thickness of the first portion ranges from about 2 mm to about 4 mm, and the thickness of the second portion ranges from about 2 mm to about 3 mm. In further embodiments, the initial thickness ranges from about 2 mm to about 4 mm, and the final thickness is less than about 2 mm. In some embodiments, from the center line to about the radial distance, the first upper surface and the first lower surface are substantially parallel one with the other, the second upper surface and the second lower surface are parallel one with the other, and the first portion and the second portion have no surfaces in a common plane.

Also provided is a wafer processing system. The exemplary wafer processing system includes a wafer process chamber, a wafer holder located in the wafer process chamber, a plurality of radiant heat elements, and at least one system coupled to the wafer process chamber and operable to perform at least wafer processing process on a wafer located on the wafer holder in the wafer process chamber. The wafer holder includes: a wafer contact portion including an upper surface and a lower surface, an exterior portion including an upper surface and a lower surface, and a tapered region formed in the wafer contact portion, the tapered region starting at a first radial distance from a center line of the wafer holder and terminating at a second radial distance from the center line. The first radial distance ranges from about 70% to about 90% of a radius of the wafer. The second radial distance is at least greater than the radius of the wafer. The tapered region has an initial thickness that gradually decreases to a final thickness.

In some embodiments, the wafer contact portion includes contact pins that are operable to support the wafer, the contact pins include a thickness ranging from about 0.5 mm to about 2 mm, and the contact pins include quartz. In various embodiments, the tapered region has a single linear profile formed on the upper surface of the wafer contact portion, the lower surface of the wafer contact portion is in a common plane with the lower surface of the exterior portion, a thickness of the wafer contact portion ranges from about 0.5 mm to about 2 mm, a thickness of the exterior portion ranges from about 1 mm to about 3 mm, and the wafer holder includes quartz. In certain embodiments, the tapered region has a single linear profile formed on the lower surface of the wafer contact portion, the wafer contact portion and the exterior portion have no surfaces in a common plane, a thickness of the wafer contact portion ranges from about 0.5 mm to about 4 mm, a thickness of the exterior portion ranges from about 1 mm to about 3 mm, and the wafer holder includes quartz.

Also provided is a method. The exemplary method includes providing a wafer process chamber and a plurality of radiant heat elements under the wafer process chamber, receiving a wafer holder configured to be used in the wafer process chamber, and processing a wafer located on the wafer holder in the wafer process chamber. The processing includes using the radiant heat elements to heat the wafer. The wafer holder includes: a wafer contact portion including an upper surface and a lower surface, an exterior portion including an upper surface and a lower surface, and a tapered region formed in the wafer contact portion, the tapered region starting at a first radial distance from a center line of the wafer holder and terminating at a second radial distance from the center line. The first radial distance ranges from about 70% to about 90% of a radius of the wafer. The second radial distance is at least greater than the radius of the wafer. The tapered region has an initial thickness that gradually decreases to a final thickness.

In some embodiments, processing the wafer includes a non-steady state heating process. In various embodiments, the non-steady state heating process includes a spike heating process. In certain embodiments, processing the wafer includes a process selected from the group consisting of chemical vapor deposition (CVD), annealing, and etching. In further embodiments, the tapered region has a single linear profile formed on the upper surface of the wafer contact portion, the lower surface of the wafer contact portion is in a common plane with the lower surface of the exterior portion, a thickness of the wafer contact portion ranges from about 0.5 mm to about 2 mm, a thickness of the exterior portion ranges from about 1 mm to about 3 mm, and the wafer holder includes quartz. In still further embodiments, the tapered region has a single linear profile formed on the lower surface of the wafer contact portion, the wafer contact portion and the exterior portion have no surfaces in a common plane, a thickness of the wafer contact portion ranges from about 0.5 mm to about 4 mm, a thickness of the exterior portion ranges from about 1 mm to about 3 mm, and the wafer holder includes quartz.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
a wafer holder including a first portion and a second portion, the first and second portions being formed of a continuous material, the first portion including a first upper surface and a first lower surface, and the second portion including a second upper surface and a second lower surface,
an interface between the first and second portions, the interface providing for a transition such that the first upper surface of the first portion tends toward the second upper surface of the second portion; and
a tapered region formed in the first portion, the tapered region starting at a radial distance from a center line of the wafer holder and terminating at the interface, the tapered region having an initial thickness that gradually decreases to a final thickness.

2. The apparatus of claim 1 wherein the tapered region has a single linear profile,
wherein the radial distance ranges from about 70% to about 90% of a radius of a wafer that the wafer holder is configured to hold, and
wherein the wafer holder includes quartz.

3. The apparatus of claim 2 wherein the interface starts at another radial distance from the center line of the wafer holder, and
wherein the another radial distance is greater than the radius of the wafer that the wafer holder is configured to hold.

4. The apparatus of claim 3 wherein a thickness of the first portion is less than a thickness of the second portion.

5. The apparatus of claim 4 wherein the thickness of the first portion ranges from about 0.5 mm to about 2 mm, and
wherein the thickness of the second portion ranges from about 2 mm to about 3 mm.

6. The apparatus of claim 5 wherein the initial thickness ranges from about 1 mm to about 2 mm, and
wherein the final thickness is less than about 1 mm.

7. The apparatus of claim 6 wherein, from the center line to about the radial distance, the first upper surface and the first lower surface are substantially parallel one with the other,
wherein the second upper surface and the second lower surface are parallel one with the other, and
wherein the first lower surface is in a common plane with the second lower surface.

8. The apparatus of claim 4 wherein the thickness of the first portion ranges from about 2 mm to about 4 mm, and
wherein the thickness of the second portion ranges from about 2 mm to about 3 mm.

9. The apparatus of claim 8 wherein the initial thickness ranges from about 2 mm to about 4 mm, and
wherein the final thickness is less than about 2 mm.

10. The apparatus of claim 9 wherein, from the center line to about the radial distance, the first upper surface and the first lower surface are substantially parallel one with the other,
wherein the second upper surface and the second lower surface are parallel one with the other, and
wherein the first portion and the second portion have no surfaces in a common plane.

11. An apparatus for holding a wafer during a heat process, the apparatus comprising:

a wafer holder having a wafer contact portion including an upper surface and a lower surface;

an exterior portion including an upper surface and a lower surface, and a tapered region formed in the wafer contact portion, the tapered region starting at a first radial distance from a center line of the wafer holder and terminating at a second radial distance from the center line, wherein the first radial distance ranges from about 70% to about 90% of a radius of the wafer, wherein the second radial distance is greater than the radius of the wafer, and wherein the tapered region has an initial thickness that gradually decreases to a final thickness.

12. The apparatus of claim 11 wherein the wafer contact portion includes contact pins that are operable to support a wafer, wherein the contact pins include a thickness ranging from about 0.5 mm to about 2 mm, and wherein the contact pins include quartz.

13. The apparatus of claim 11 wherein the heat process is a non-steady state heating process.

14. The apparatus of claim 13 wherein the non-steady state heating process includes a spike heating process.

15. The apparatus of claim 11 wherein the heat process is selected from the group consisting of chemical vapor deposition (CVD), annealing, and etching.

16. The apparatus of claim 11 wherein the tapered region has a single linear profile formed on the upper surface of the wafer contact portion, wherein the lower surface of the wafer contact portion is in a common plane with the lower surface of the exterior portion, wherein a thickness of the wafer contact portion ranges from about 0.5 mm to about 2 mm, wherein a thickness of the exterior portion ranges from about 1 mm to about 3 mm, and wherein the wafer holder includes quartz.

17. The apparatus of claim 11 wherein the tapered region has a single linear profile formed on the lower surface of the wafer contact portion, wherein the wafer contact portion and the exterior portion have no surfaces in a common plane, wherein a thickness of the wafer contact portion ranges from about 0.5 mm to about 4 mm, wherein a thickness of the exterior portion ranges from about 1 mm to about 3 mm, and wherein the wafer holder includes quartz.

* * * * *